United States Patent
Yu et al.

(10) Patent No.: US 10,897,733 B2
(45) Date of Patent: Jan. 19, 2021

(54) APPARATUSES AND METHODS FOR MEASURING NEIGHBORING INTER-FREQUENCY OR INTER-RAT CELLS

(71) Applicant: Apple Inc., Cupertino, CA (US)

(72) Inventors: Zhibin Yu, Unterhaching (DE); Bernhard Sogl, Unterhaching (DE); Markus Dominik Mueck, Unterhaching (DE); Biljana Badic, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/328,741

(22) PCT Filed: Aug. 1, 2017

(86) PCT No.: PCT/US2017/044781
§ 371 (c)(1),
(2) Date: Feb. 27, 2019

(87) PCT Pub. No.: WO2018/063494
PCT Pub. Date: Apr. 5, 2018

(65) Prior Publication Data
US 2019/0200270 A1    Jun. 27, 2019

(30) Foreign Application Priority Data

Sep. 28, 2016   (EP) .................................. 16191012

(51) Int. Cl.
*H04W 36/00*   (2009.01)
*H04W 36/30*   (2009.01)
(Continued)

(52) U.S. Cl.
CPC .......... *H04W 36/30* (2013.01); *H03F 1/3247* (2013.01); *H03F 3/24* (2013.01);
(Continued)

(58) Field of Classification Search
CPC ..... H04W 36/30; H04B 17/13; H04B 25/063; H04B 1/3805; H03F 1/3247; H03F 3/24
(Continued)

(56) References Cited

U.S. PATENT DOCUMENTS 6,380,748 B1 *  4/2002  Kang ..................... G01R 27/06
                                                    324/645
7,136,627 B2 *  11/2006 Hamalainen ......... H04B 7/0634
                                                    455/101
(Continued)

FOREIGN PATENT DOCUMENTS

EP           1871133 A1   12/2007

*Primary Examiner* — Danh C Le
(74) *Attorney, Agent, or Firm* — Kowert, Hood, Munyon, Rankin & Goetzel, P C.

(57) ABSTRACT

The present disclosure relates to a user equipment (200) for a wireless communication system. The user equipment comprises a transmitter (210) configured to generate a transmit signal (220), a transmitter feedback receiver (230) coupled to the transmitter and configured to measure a power of the transmit signal in a first mode of operation, and control circuitry (240) configured to select a second mode of operation of the transmitter feedback receiver, in which the transmitter feedback receiver (230) is configured to measure one or more neighboring inter-frequency or inter-RAT base stations.

22 Claims, 10 Drawing Sheets mode 1: TX feedback
mode 2: neighbor cell measurement

(51) Int. Cl.
  *H04B 1/3805* (2015.01)
  *H04B 17/13* (2015.01)
  *H03F 1/32* (2006.01)
  *H03F 3/24* (2006.01)
  *H04L 25/06* (2006.01)

(52) U.S. Cl.
  CPC .......... *H04B 1/3805* (2013.01); *H04B 17/13* (2015.01); *H04L 25/063* (2013.01)

(58) Field of Classification Search
  USPC ................ 455/436, 418, 550.1; 370/331
  See application file for complete search history.

(56) References Cited

U.S. PATENT DOCUMENTS

| | | | | |
|---|---|---|---|---|
| 7,961,812 B2* | 6/2011 | Jensen | ............... | H03C 5/00 |
| | | | | 375/146 |
| 8,271,015 B2* | 9/2012 | Aoki | ............... | A61B 5/0002 |
| | | | | 455/522 |
| 8,995,502 B1* | 3/2015 | Lai | ............... | H04L 25/00 |
| | | | | 375/219 |
| 9,602,149 B1* | 3/2017 | Tanzi | ............... | H04B 17/318 |
| 10,165,490 B1* | 12/2018 | Govindassamy | ..... | H04W 76/14 |
| 2003/0186698 A1 | 10/2003 | Holma et al. | | |
| 2006/0050810 A1* | 3/2006 | Haque | ............... | H03F 3/24 |
| | | | | 375/297 |
| 2008/0284491 A1* | 11/2008 | Veendrick | ......... | H03K 19/0019 |
| | | | | 327/427 |
| 2011/0267146 A1* | 11/2011 | Finocchiaro | .......... | H03L 7/0891 |
| | | | | 331/2 |
| 2012/0196546 A1* | 8/2012 | Ly-Gagnon | ............... | H03F 3/24 |
| | | | | 455/73 |
| 2012/0281772 A1 | 11/2012 | Bailey et al. | | |
| 2012/0307748 A1* | 12/2012 | Cheng | ............... | H04L 5/0042 |
| | | | | 370/329 |
| 2012/0327879 A1* | 12/2012 | Stadelmeier | .......... | H04L 5/0042 |
| | | | | 370/329 |
| 2013/0217343 A1* | 8/2013 | Tenbroek | ............... | H04B 17/14 |
| | | | | 455/77 |
| 2013/0223398 A1 | 8/2013 | Li et al. | | |
| 2013/0294416 A1* | 11/2013 | Li | ............... | H04W 36/30 |
| | | | | 370/332 |
| 2014/0036710 A1 | 2/2014 | Chin et al. | | |
| 2014/0119334 A1 | 5/2014 | Kazmi et al. | | |
| 2014/0185484 A1 | 7/2014 | Kim et al. | | |
| 2015/0045024 A1* | 2/2015 | Lunden | ............... | H04W 48/16 |
| | | | | 455/434 |
| 2015/0118980 A1 | 4/2015 | Leung et al. | | |
| 2015/0280673 A1 | 10/2015 | Tasic et al. | | |
| 2015/0280946 A1 | 10/2015 | Sabouri et al. | | |
| 2015/0312807 A1 | 10/2015 | Nie et al. | | |
| 2016/0057756 A1* | 2/2016 | Nammi | ............. | H04W 72/0466 |
| | | | | 370/335 |
| 2016/0142950 A1* | 5/2016 | Kumar | ............... | H04B 7/04 |
| | | | | 455/436 |
| 2016/0330641 A1* | 11/2016 | Zhang | ............... | H04W 24/02 |
| 2016/0373948 A1* | 12/2016 | Sanka | ............... | H04W 24/08 |
| 2017/0174442 A1* | 6/2017 | Coots | ............... | B65G 37/00 |
| 2017/0329381 A1* | 11/2017 | Chew | ............... | G06F 1/3275 |
| 2018/0184309 A1* | 6/2018 | Bhardwaj | .......... | H04W 24/04 |

* cited by examiner

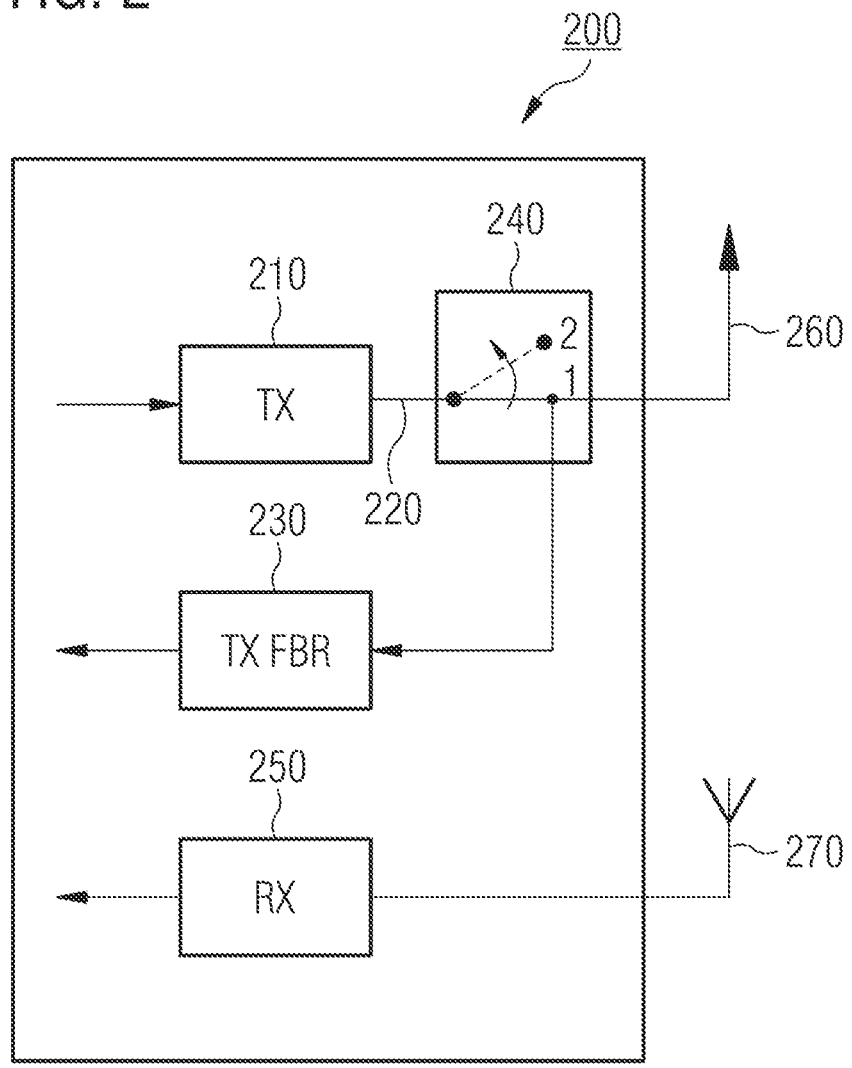

APPARATUSES AND METHODS FOR MEASURING NEIGHBORING INTER-FREQUENCY OR INTER-RAT CELLS

FIELD

The present disclosure generally relates to mobile communication systems and, more particularly, to apparatuses and methods for increasing downlink throughput and enhancing measurements of neighboring inter-frequency or inter-RAT cells (RAT=Radio Access Technology).

BACKGROUND

In wireless modem design and production, mobility (for example, handover performance) and downlink (DL) throughput are two performance indicators. Handover performance depends on neighboring cell search and measurement update rate. The more frequently a mobile terminal, which may also be referred to as User Equipment (UE) according to the $3^{rd}$ Generation Partnership Project (3GPP) specifications, detects neighboring cells or base stations and measures them, the better a UE can monitor environment changes (for example, cell fades in/out when UE is moving), leading to better handover performance.

However, a high measurement update rate does not come for free. For example, for inter-frequency (inter-freq) handover, at a fixed point of time, the number of frequency carriers that can be measured in parallel is dominated by the UE's number of Radio Frequency (RF) receiver chains which are available for inter-frequency or inter-RAT measurements. For example, for Long-Term Evolution (LTE) inter-frequency measurement in connected mode a UE which is generating DL throughput by demodulating the intra-frequency serving cell has to be periodically interrupted by so-called measurement gaps. A measurement gap interrupts downlink signal demodulation of the serving cell frequency carrier and switches a Radio Frequency (RF) receiver port to a different frequency carrier to apply search and measurement there. After inter-frequency or inter-RAT measurement is done, the RF receiver port switches back to the serving cell frequency. According to 3GPP for LTE connected mode, the serving cell data demodulation has to be interrupted regularly for a certain duration, thereby sacrificing DL throughput performance because of the interruption of the serving cell demodulation chain.

Thus, there is a need for improved concepts for measuring neighboring inter-frequency or inter-RAT base stations.

BRIEF DESCRIPTION OF THE DRAWINGS

Some examples of apparatuses and/or methods will be described in the following by way of example only, and with reference to the accompanying figures, in which

FIG. 2 illustrates a block diagram of a user equipment according to examples of the present disclosure;

DESCRIPTION OF EMBODIMENTS

Figure 1:
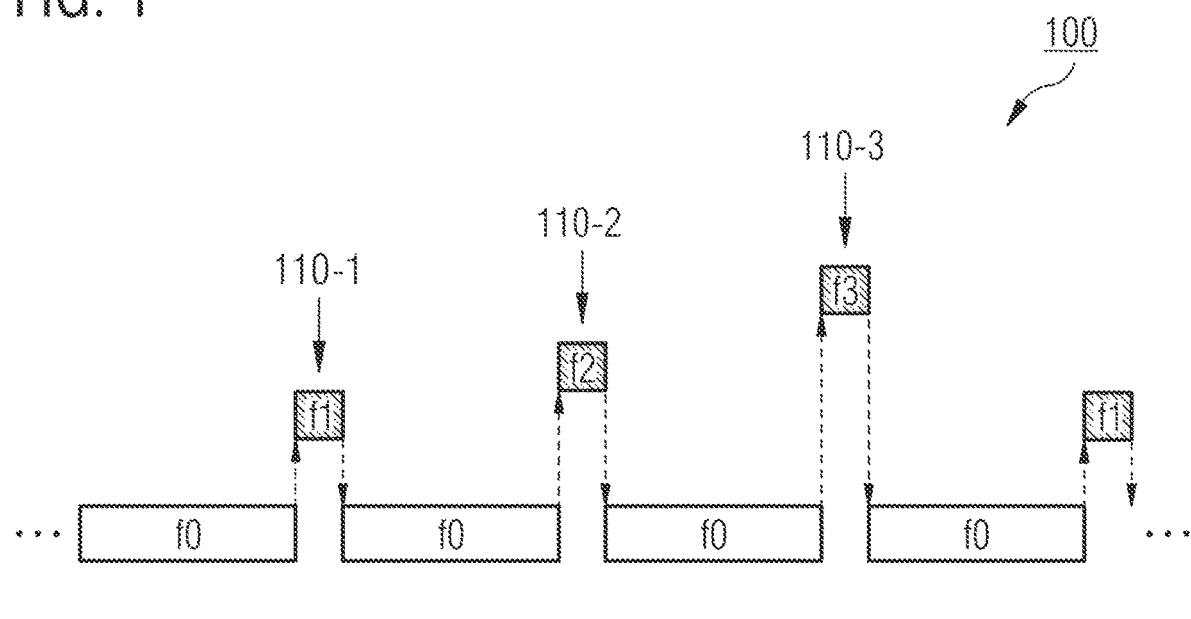
FIG. 1 shows an example of an inter-frequency measurement scenario.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Thus, the skilled person having benefit form the present disclosure will appreciate that the terms "cell", "base station" or "access point" may be used interchangeably throughout the present disclosure. A cell need not necessarily be part of a cellular communication system, but can more generally be understood as an area served by a base station or access point of a wireless communication system to provide radio coverage in that area. The term "cell" can refer to sectors of a cell, to macrocells, microcells, picocells, femtocells, or the like. Typically a cell has associated therewith a unique cell identifier (cell ID). Generally, macrocells provide coverage larger than small cells including microcells, picocells, and femtocells. Small cells are low-powered radio access nodes that can operate in licensed and unlicensed spectrum that have a range of 10 meters to 1 or 2 kilometers. They are "small" compared to a mobile macrocell, which may have a range of a few tens of kilometers. The antennas for macrocells can be mounted on ground-based masts, rooftops and other existing structures, at a height that provides a clear view over the surrounding buildings and terrain. A cell may also be a WiFi hotspot, for example.

In single-carrier mobile communication networks, an intra-frequency (intra-freq) measurement occurs when a current serving and a potential target cell operate on the same carrier frequency. In such a scenario, a UE may be able to carry out such measurements without measurement gaps. This is because the RF receiver of the UE may be able to measure reference signals of the target cell while simultaneously performing data communication in the serving cell on the same carrier frequency.

On the other hand, inter-frequency (inter-freq) measurement occurs when the potential target cell operates on a different carrier frequency as compared to the current serving cell. For example, the carrier frequency of the current serving cell may be $f_0$, while the carrier frequency of the potential target cell may be $f_1$. Similarly, inter-RAT (Radio Access Technology) measurement occurs when the target cell operates on a different RAT as compared to the current cell. For example, the RAT of the current serving cell may be LTE, while the RAT of the potential target cell may be UMTS (Universal Mobile Telecommunication System) or WiFi (Wireless Fidelity).

FIG. 1 illustrates an example of an inter-freq measurement scenario 100.

In the illustrated example, three inter-frequency carriers f1, f2, and f3 are monitored. In the example of FIG. 1, a UE is served in a current cell on carrier frequency f0, while different target cells operate on different carrier frequencies f1, f2 and f3. In such a scenario, a UE having only one RF receiver is typically not able to carry out target cell measurements without subsequent measurement gaps 110. This is because the RF receiver of UE needs to switch to a different carrier frequency to perform respective measurements and then switch back to f0 to perform data communication. Thus, measurement gaps 110 are typically needed by the UE (having a single RF receiver chain) to monitor cells on other frequencies than the serving cell, i.e. inter-frequency as well as inter-RAT (e.g. GSM and 3G) cells. Measurement gaps 110 are periods where UE switches off its receiver and transmitter from the serving cell and starts listening to neighboring cells. Each measurement gap 110-1, 110-2, and 110-3 interrupts the downlink signals demodulation in the serving cell frequency carrier 10, and switches the RF receiver port to a different frequency carrier to apply search and measurement there. After inter-freq measurement is done, the RF receiver port switches back to the serving cell frequency f0. According to 3GPP for LTE connected mode, the serving cell data demodulation has to be interrupted every 40 ms (or every 80 ms depending on eNodeB configurations) for a 6 ms duration. Note that base stations may also be referred to as NodeB or eNodeB according to 3GPP terminology.

The skilled person having benefit from the present disclosure will easily appreciate that in measurement scenario 100 the DL throughput performance is sacrificed because of the interruption of the serving cell demodulation chain. The shortcomings of FIG. 1 are that the intrafreq serving cell reception and demodulation is interrupted periodically (for example, 6 ms out of every 40 ms or 80 ms), which gives non-optimal throughput (for example, 15% throughput loss comparing with non-interruption case). Further, the UE can apply measurement only in one inter-freq carrier at a time. When the number of monitored frequency carriers is increased, the search and measurement rate is going down accordingly which degrades the handover performance. To highlight this problem, in 3GPP release 12, Increased-number-of-frequencies-to-Monitor (IncMon) feature is introduced which increases the required number of monitored carriers from three to eight. Although conventional single inter-frequency carrier measurement can still meet the 3GPP minimal requirement, the handover performance in the field will degrade because measurement rate is reduced.

To overcome above mentioned issues one could make use of a second RF receiver chain, for example, in case the UE supports Carrier Aggregation (CA). Carrier aggregation can be used in order to increase the bandwidth, and thereby increase the bitrate. Each aggregated carrier is referred to as a Component Carrier (CC). For example, a component carrier can have a bandwidth of 1.4, 3, 5, 10, 15 or 20 MHz and a maximum of five component carriers may be aggregated, hence the maximum aggregated bandwidth may be 100 MHz. In Frequency Division Duplex (FDD) the number of aggregated carriers can be different in downlink (DL) and uplink (UL). If a second component carrier is not activated, the UE could then measure a different inter-freq carrier in parallel so that the UE does not need to switch off the RF receiver port which is used for the serving cell throughput. However, if a UE does not support CA (as, for example, low-cost devices) and thus does not provide multiple RF receiver chains this concept does not work. Also, when the UE works in full CA mode, this concept does not work because all RF receiver chains would already be busy for CA. Furthermore, the supported inter-freq carriers are restricted by band limitations. A RF receiver port for an aggregated carrier usually only supports a portion of frequency bands (while the other port will support the remaining). So there can be inter-frequency carriers which cannot be supported by the second RF receiver port. Of course, another solution would be just to add an additional dedicated independent RF receiver chain just for inter-freq measurements. However, the hardware cost for this would be prohibitive.

The present disclosure proposes to perform inter-freq and/or inter-RAT measurements using a UE's transmitter FeedBack Receiver (TX FBR). Thereby a TX FBR is an existing component in multiple existing RF transceivers and commonly serves purposes like closed-loop transmission power control and TX or calibration. Thus, a TX FBR usually receives a fed back version of a transmit signal from the transmitter portion of the transceiver. For that purpose, the TX FBR is coupled to the transmitter for feedback—unlike a main receiver of the UE. A TX FBR can comprise a full RF receiver chain starting from getting analog RF signals until generating final digitalized Inphase and Quadrature (IQ) data streams. During inter-freq measurement gaps, uplink (UL) transmission is usually disabled. Thus, the present disclosure proposes to use the TX FBR for downlink reception at this moment.

FIG. 2 illustrates a schematic block diagram of a UE 200 employing the proposed concept.

UE 200 comprises transmit circuitry 210 which is configured to generate an RF transmit signal 220 which can be radiated via one or more antennas 260. UE 200 also comprises a transmitter feedback receiver (TX FBR) 230 which is coupled to transmit circuitry 210 or a signal path thereof in order to feed back transmit signal 220 and to measure parameters, such as a power, for example, of transmit signal 220 in a first mode of operation of TX FBR 230. Thus, TX FBR 230 receives a fed back version of transmit signal 220 during the first mode of operation. UE 200 also comprises control circuitry 240 which is configured to select a second mode of operation of TX FBR 230, in which TX FBR 230 is configured to measure one or more neighboring inter-frequency or inter-RAT cells and thus performs spectrum sensing. Thus, the TX FBR 230 can receive and evaluate signals, such as synchronization signals, from neighboring cells during the second mode of operation.

In addition to TX FBR 230, UE 200 typically also comprises main receiver circuitry 250 for receiving and demodulating a serving cell signal at one or more serving cell carrier frequencies, depending on whether carrier aggregation is used or not. Thus, main receiver circuitry 250 can comprise more than one parallel RF receiver chain, if UE 200 is capable of carrier aggregation. Main receiver circuitry 250 can be coupled to the one or more antennas 260 which are also used for transmitting transmit signal 220 or can be coupled to one ore more dedicated RX antennas 270, depending on the design of UE 200. In comparison to TX FBR 230, main receiver circuitry 250 does not receive and evaluate a fed back version of transmit signal 220 from the UE's transmitter portion 210. Instead it is configured to receive and evaluate downlink signals from base stations.

The skilled person having benefit from the present disclosure will appreciate that TX FBR 230 of UE 200 can be used for inter-frequency or inter-RAT measurements instead of as well as in addition to main receiver circuitry 250 of UE 200, thus enabling enhancements of inter-freq and/or inter-RAT measurement of mobile terminals used in mobile communication systems. The proposed functionality of UE 200 may be purely achieved with amendments of a conventional UE's firmware in some examples. Also, there may be hardware modifications with respect to conventional UEs not having the proposed features.

Figure 10:
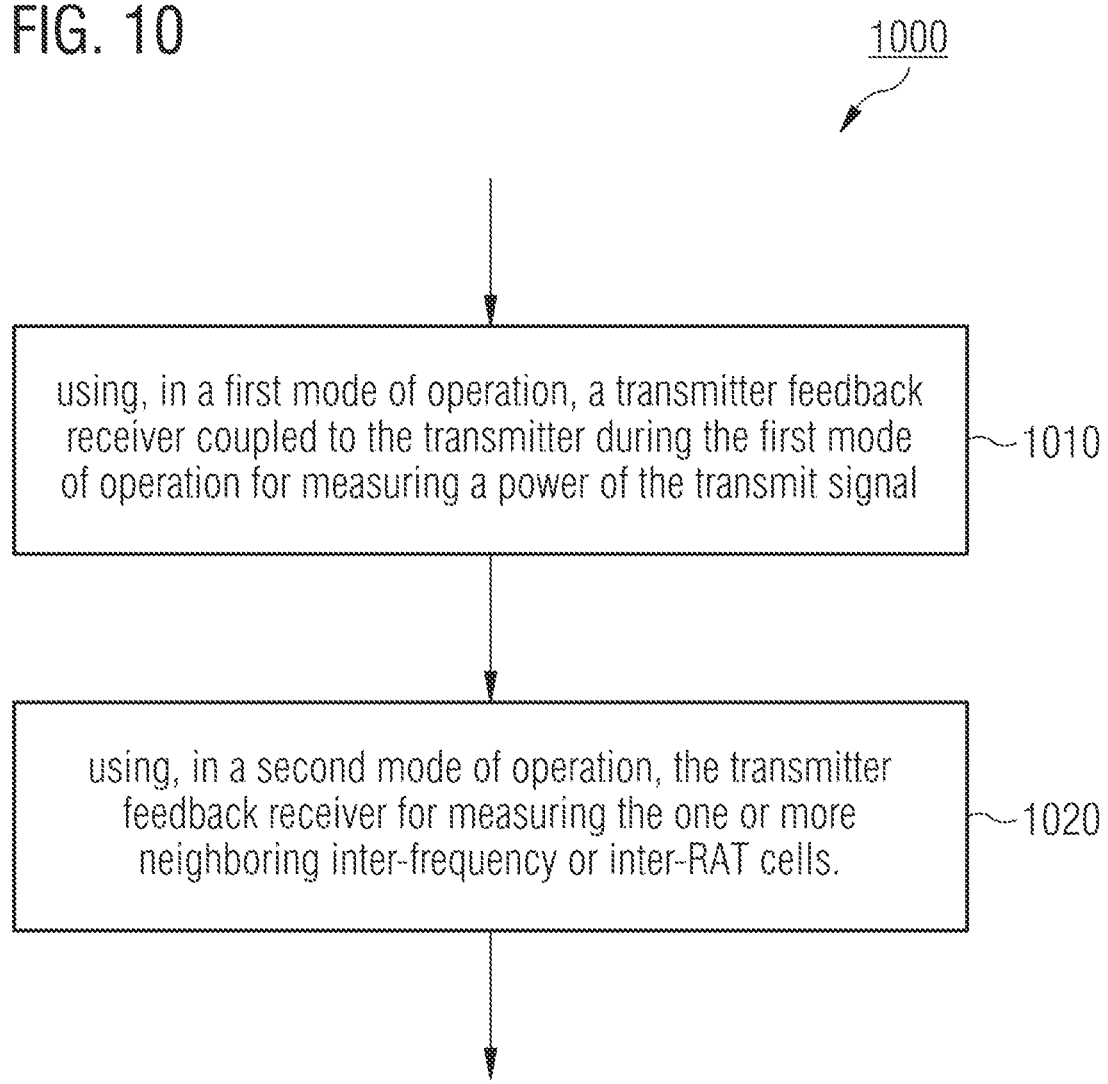
FIG. 10 illustrates a method for measuring one or more neighboring inter-frequency or inter-RAT cells according to an example.

UE 200 can be used to carry out a method in accordance with the present disclosure. An example of such a method 1000 for measuring one or more neighboring inter-frequency or inter-RAT cells with a UE of a cellular communication system is shown in FIG. 10.

Method 1000 includes using 1010, in a first mode of operation (e.g., uplink transmission), the UE's transmitter feedback receiver coupled to the UE's transmitter during the first mode of operation for measuring a power of the transmit signal. In a second mode of operation (e.g. neighbor cell spectrum sensing), the transmitter feedback receiver is used 1020 for measuring the one or more neighboring inter-frequency or inter-RAT cells.

In general, examples of the present disclosure are applicable to any kind of wireless system such as for example 3GPP (Third Generation Partnership Project) specifications, notably Long Term Evolution (LTE) and Long Term Evolution-Advanced (LTE-A) and LTE-Advanced Pro. It is understood that such exemplary scenarios are demonstrative in nature, and accordingly may be similarly applied to other mobile communication technologies and standards, such as any Cellular Wide Area radio communication technology, which may include e.g. a 5th Generation (5G) communication systems, a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology (e.g. UMTS (Universal Mobile Telecommunications System), FOMA (Freedom of Multimedia Access), 3GPP LTE (Long Term Evolution), 3GPP LTE Advanced (Long Term Evolution Advanced)), 3GPP LTE-Advanced Pro, CDMA2000 (Code division multiple access 2000), CDPD (Cellular Digital Packet Data), Mobitex, 3G (Third Generation), CSD (Circuit Switched Data), HSCSD (High-Speed Circuit-Switched Data), UMTS (3G) (Universal Mobile Telecommunications System (Third Generation)), W-CDMA (UMTS) (Wideband Code Division Multiple Access (Universal Mobile Telecommunications System)), HSPA (High Speed Packet Access), HSDPA (High-Speed Downlink Packet Access), HSUPA (High-Speed Uplink Packet Access), HSPA+ (High Speed Packet Access Plus), UMTS-TDD (Universal Mobile Telecommunications System-Time-Division Duplex), TD-CDMA (Time Division-Code Division Multiple Access), TD-CDMA (Time Division-Synchronous Code Division Multiple Access), 3GPP Rel. 8 (Pre-4G) (3rd Generation Partnership Project Release 8 (Pre-4th Generation)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel 13 (3rd Generation Partnership Project Release 14), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17), 3GPP LTE Extra, LTE Licensed-Assisted Access (LAA), UTRA (UMTS Terrestrial Radio Access), E-UTRA (Evolved UMTS Terrestrial Radio Access), LTE Advanced (4G) (Long Term Evolution Advanced (4th Generation)), ETSI OneM2M, IoT (Internet of things), cdmaOne (2G), CDMA2000 (3G) (Code division multiple access 2000 (Third generation)), EV-DO (Evolution-Data Optimized or Evolution-Data Only), AMPS (1G) (Advanced Mobile Phone System (1st Generation)), TACS/ETACS (Total Access Communication System/Extended Total Access Communication System), D-AMPS (2G) (Digital AMPS (2nd Generation)), PTT (Push-to-talk), MTS (Mobile Telephone System), IMTS (Improved Mobile Telephone System), AMTS (Advanced Mobile Telephone System), OLT (Norwegian for Offentlig Landmobil Telefoni, Public Land Mobile Telephony), MTD (Swedish abbreviation for Mobiltelefonisystem D, or Mobile telephony system D), Autotel/PALM (Public Automated Land Mobile), ARP (Finnish for Autoradiopuhelin, "car radio phone"), NMT (Nordic Mobile Telephony), Hicap (High capacity version of NTT (Nippon Telegraph and Telephone)), CDPD (Cellular Digital Packet Data), Mobitex, DataTAC, iDEN (Integrated Digital Enhanced Network), PDC (Personal Digital Cellular), CSD (Circuit Switched Data), PHS (Personal Handyphone System), WIDEN (Wideband Integrated Digital Enhanced Network), iBurst, Unlicensed Mobile Access (UMA, also referred to as also referred to as 3GPP Generic Access Network, or GAN standard)), Wireless Gigabit Alliance (WiGig) standard, mmWave standards in general (wireless systems operating at 10-90 GHz and above such as WiGig, IEEE 802.11ad, IEEE 802.11ay, etc.), etc. The examples provided herein are thus understood as being applicable to various other mobile communication technologies, both existing and not yet formulated, particularly in cases where such mobile communication.

UE or mobile terminal 200 can be any device used by an end-user to communicate. It can be a hand-held telephone, such as a smartphone, a laptop computer equipped with a mobile broadband adapter, or any other device. It can connect to base stations or NodeB/eNodeB's and/or to WiFi access points.

To provide a better understanding of the proposed concept, an example of a conventional transmitter feedback receiver will be described with reference to FIG. 3A before illustrating a modified transmitter feedback receiver according to an example of the present disclosure in FIG. 3B.

Figure 3A:
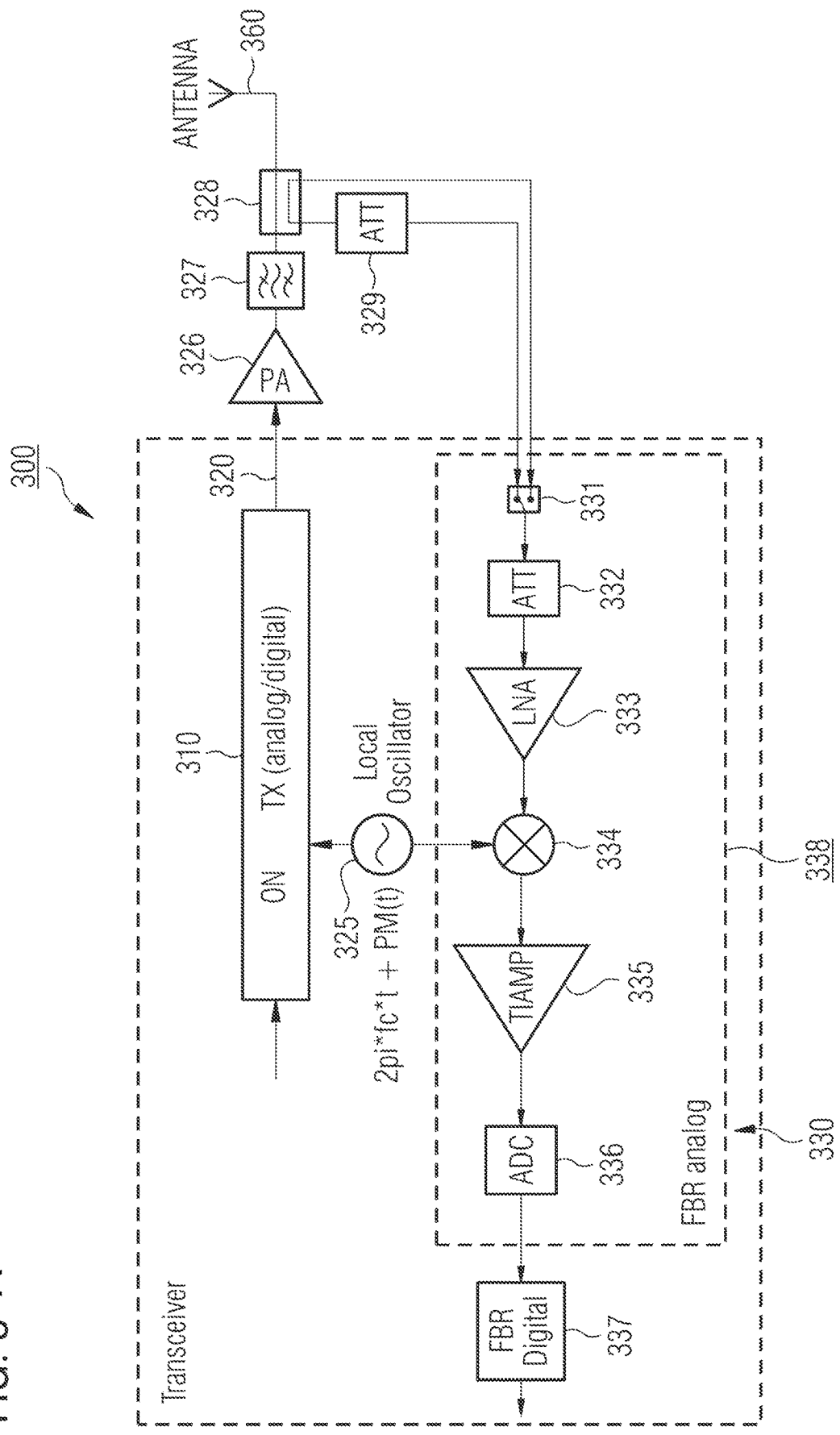
FIG. 3A shows a conventional transmitter feedback receiver design.
Figure 3:
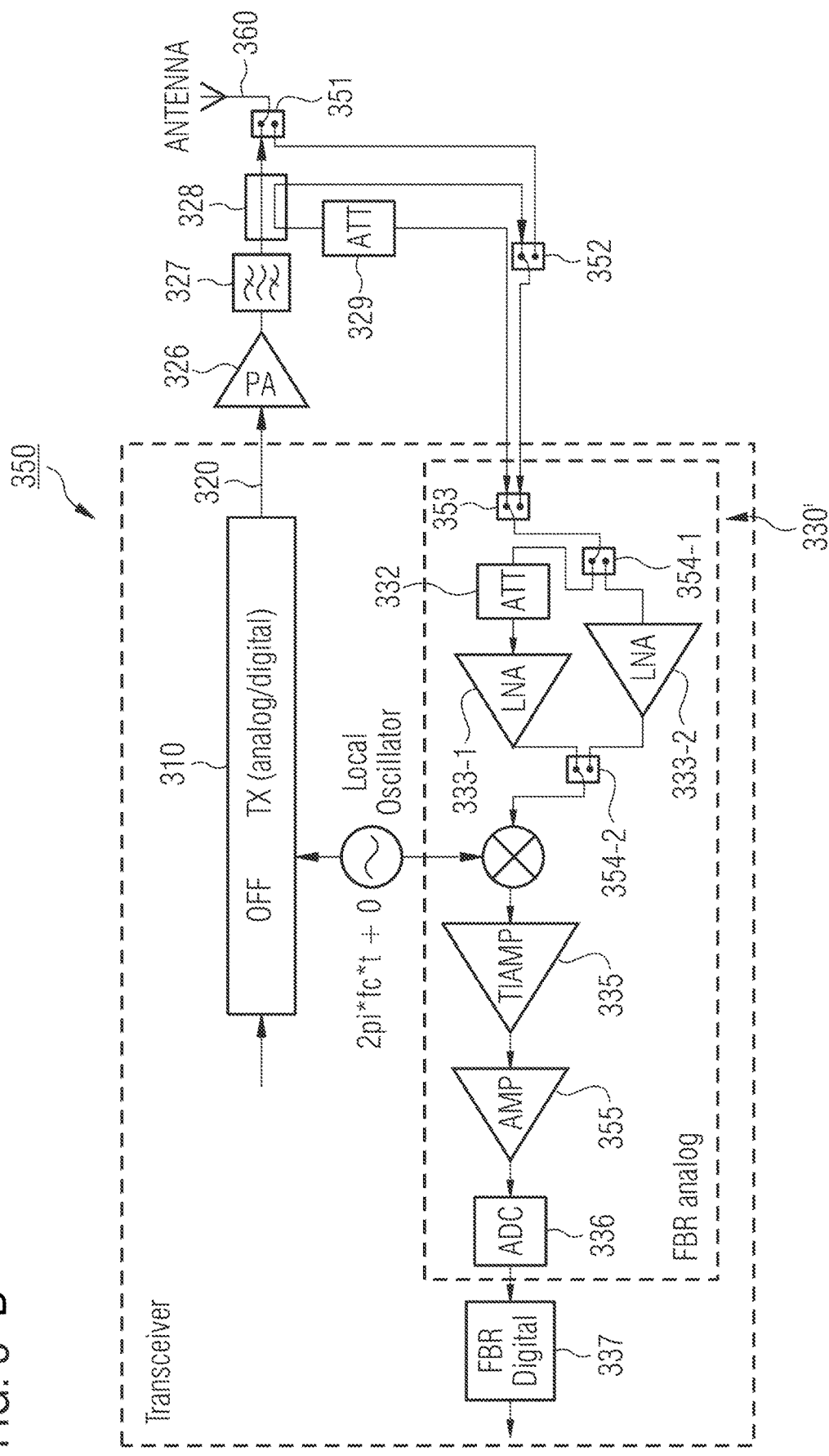
FIG. 3B shows a transmitter feedback receiver design according to an example.

FIG. 3A shows a block diagram of a transceiver circuit 300, which can be used in a UE. Transceiver circuit 300 comprises a transmit (TX) portion 310 which is configured to generate an RF transmit signal 320. The skilled person having benefit from the present disclosure will appreciate that TX portion 310 can include digital as well as analog circuit components. For example, baseband signal processing can be performed in the digital domain by using digital hardware components such as Digital Signal Processors (DSPs), Field Programmable Gate Arrays (FPGAs), Application Specific Integrated Circuits (ASICs) or the like. A digital baseband signal can be transformed into the analog domain by using one or more Digital-to-Analog Converters (DACs). In case of polar modulation techniques, the phase PM(t) of an RF signal at frequency $f_c$, which is generated by a controllable local oscillator 325, can be directly modulated. The resulting RF TX signal 320 can be amplified by Power Amplifier (PA) 326 and filtered by a bandpass filter 327 before being radiated via antenna 360. The transmit path also includes a directional coupler 328 which is configured to couple a defined amount of the electromagnetic TX power in the TX path to a port enabling the RF TX signal to be fed back to transmitter feedback receiver 330. Thus, transmitter feedback receiver 330 is coupled to TX portion 310 via coupler 328. A first attenuator (ATT) 329 can be used to decrease the power of the fed back RF TX signal.

The example transmitter feedback receiver 330 comprises an analog direct demodulator and a digital frontend 337 for data post-processing. The analog demodulation path includes a switch 331 for selecting or bypassing the first attenuator (ATT) 329. The selected signal is fed to a second attenuator (ATT) 332 for input power levelling followed by a Low-Noise Amplifier (LNA) 333. A mixer 334 for down-converting the output signal of LNA 334 is driven by local oscillator 325 tuned to the channel frequency fc and typically containing the modulated phase signal PM(t) on top. Thus, transmitter feedback receiver 330 uses RF TX signal 320 for down-converting the fed back RF TX signal. In other words, transmitter feedback receiver 330 and transmitter 310 share the same LO 325. A Trans Impedance Amplifier (TIAMP) 335 can be used for fine-tuning the input signal amplitude of the down-converted signal to provide a full-scale baseband signal to Analog-to-Digital Converter (ADC) 336.

Conventionally, transmitter feedback receiver 330 is operated together with TX portion 310 and used mainly for power measurements in TX transmission mode (first mode).

To fulfill power control requirements, the transmitter feedback receiver gain can be fixed for each Frequency Band and RAT (Radio Access Technology). With that a dynamic range of about 30 dB can be achieved maintaining a Signal-to-Noise Ratio (SNR) of 26 dB. However, this dynamic range may be insufficient to cover all cases.

In the example of FIG. 3A, the TX architecture comprises a polar transmitter, i.e. the Local Oscillator is containing the phase modulation of the transmit signal PM(t) which distorts the signal demodulation in the transmitter feedback receiver. Thus, during TX transmission a full signal demodulation might not be possible with the illustrated architecture. The amplitude of the down-converted signal would be undistorted, but the phase of the down-converted signal would be distorted. Thus, in particular when polar modulation is employed in the transmit path, TX 310 or certain portions thereof may be deactivated when the transmitter feedback receiver is to be used for spectrum sensing during its second mode of operation. Thus, control circuitry 240 (see FIG. 2) can be configured to deactivate at least a portion of the transmitter 310 during the second mode of operation of the transmitter feedback receiver. In particular, the polar modulation of LO 325 may be switched off during the second mode of operation, i.e., PM(t)=0. This allows the transmitter feedback receiver 330 to be coupled to LO 325 operating at constant (carrier) frequency (without phase modulation) during the second mode of operation. In some examples, the LO 325 may subsequently be tuned to different carrier frequencies (e.g., f1, f2, f3, see FIG. 1) of potential neighboring target cells during the second mode of operation.

This and other example adaptations to the transmitter feedback receiver layout of FIG. 3A to enable the transmitter feedback receiver 330 for RX cell search and measurement can be seen in the example of FIG. 3B.

The example transceiver 350 shown in FIG. 3B differs from transceiver 300 of FIG. 3A in several aspects. For example, it comprises a switch 351 between coupler 328 and antenna 360. During the first mode of operation (TX feedback) switch 351 allows the TX signal 320 to propagate from coupler 328 to antenna 360. During the second mode of operation (spectrum sensing) switch 351 decouples coupler 328 and upstream TX portions from antenna 360 and allows RX signals to propagate from antenna 360 to modified transmitter feedback receiver 330'. Further switches 352, 353 can be used to bypass coupler 328 and/or attenuator 329 to increase the gain at least by the coupling factor (for example, 20 dB). Thus, control circuitry 240 can comprise one or more switches 351, 352, 353 configured to couple transmitter feedback receiver 330' to the transmit path of the transmit circuitry 310 during the first mode of operation and to connect the transmitter feedback receiver 330' to at least one (RX) antenna 360 during the second mode of operation. The skilled person having benefit from the present disclosure will appreciate that bypassing coupler 328 and/or attenuator 329 may be achieved in various ways and that the illustrated example is only one out of many possible implementations.

Switches 354-1 and 354-2 can be used to select, during the second mode of operation, a second LNA 333-2 with improved noise figure and gain (for example, adding 10 dB) with respect to first LNA 333-1 used during the first mode of operation, compromising a slightly higher current consumption. Note that bypass switch 354-1 could also be placed after attenuator 332 in other implementations. Thus, in the example depicted in FIG. 3B, modified transmitter feedback receiver 330' comprises a first LNA 333-1 with a first noise figure and a first gain for use during the first mode of operation and a second LNA 333-2 with a second noise figure lower than the first noise figure and with a second gain higher than the first gain for use during the second mode of operation. In this way the sensitivity of the transmitter feedback receiver 330' can be increased for spectrum sensing during the second mode of operation. The skilled person having benefit from the present disclosure will appreciate that the usage of different LNAs for the different modes of operation is optional. In some examples, only one LNA for both modes may be used. Thereby the RX sensitivity of the transmitter feedback receiver can be the same for both modes or can be varied by other means, such as applying different levels of signal attenuation in the first and second mode, respectively. Thus, attenuator 332 may also be a variably adjustable attenuator in some implementations, for example. In the example of FIG. 3B, the input of ADC 336 is getting an additional gain stage 355 yielding additional 20 dB, for example. The additional gain stage 355 may be part of the existing TIAMP 335, a bypass of TIAMP 335, or a separate gain stage in the chain before or after TIAMP 335.

The example architecture of FIG. 3B is capable of levelling a wide range of antenna power. After the enhancement of bypassing coupler 328 using switch 352, additional amplifier 355 and new LNA 333-2, even RX sensitivity requirements for LTE inter-freq measurement can be fulfilled.

In the examples described herein, normal or conventional transmitter feedback receiver operation during TX transmission (first mode) need not be changed, as the modifications in the transmitter feedback receiver are not affecting that (first) mode of operation. In some examples, the TX can be deactivated during RX channel search (second mode of operation). Therefore the transmitter feedback receiver can be operated with an LO tuned to constant frequency (no phase modulation). The demodulated signal after the transmitter feedback receiver can be sampled in the FBR digital block 337 and further post-processed in a baseband processor (not shown). The impact of the modifications on baseband may mainly be covered by firmware changes. Hardware changes to baseband processing are not necessary. In the baseband, a Cell Search Component (CSC) is the major component which applies the signal processing for neighboring cell search and neighboring cell measurement. In baseband architecture, CSC may be running independently from a throughput demodulation chain. Because of that, in order to support the proposed concept, CSC does not have to be interrupted and can act almost transparent when IQ samples are actually coming from the TX feedback receiver and not the main RX receiver. One special consideration is that, by using this proposed concept, the IQ samples may be coming only from one physical antenna since TX may only use one antenna. But from the baseband point of view, it may behave the same as single RX mode which is already supported by current products. Therefore, functional wise, to support the proposed concept, it does not need hardware change.

Performance wise, two example sub-methods in baseband processing part will we described in the following to keep the LTE search and measurement performance when IQ samples are fed from the transmitter feedback receiver. Both ideas also do not need baseband hardware change of conventional products but merely a firmware change.

Figure 4:
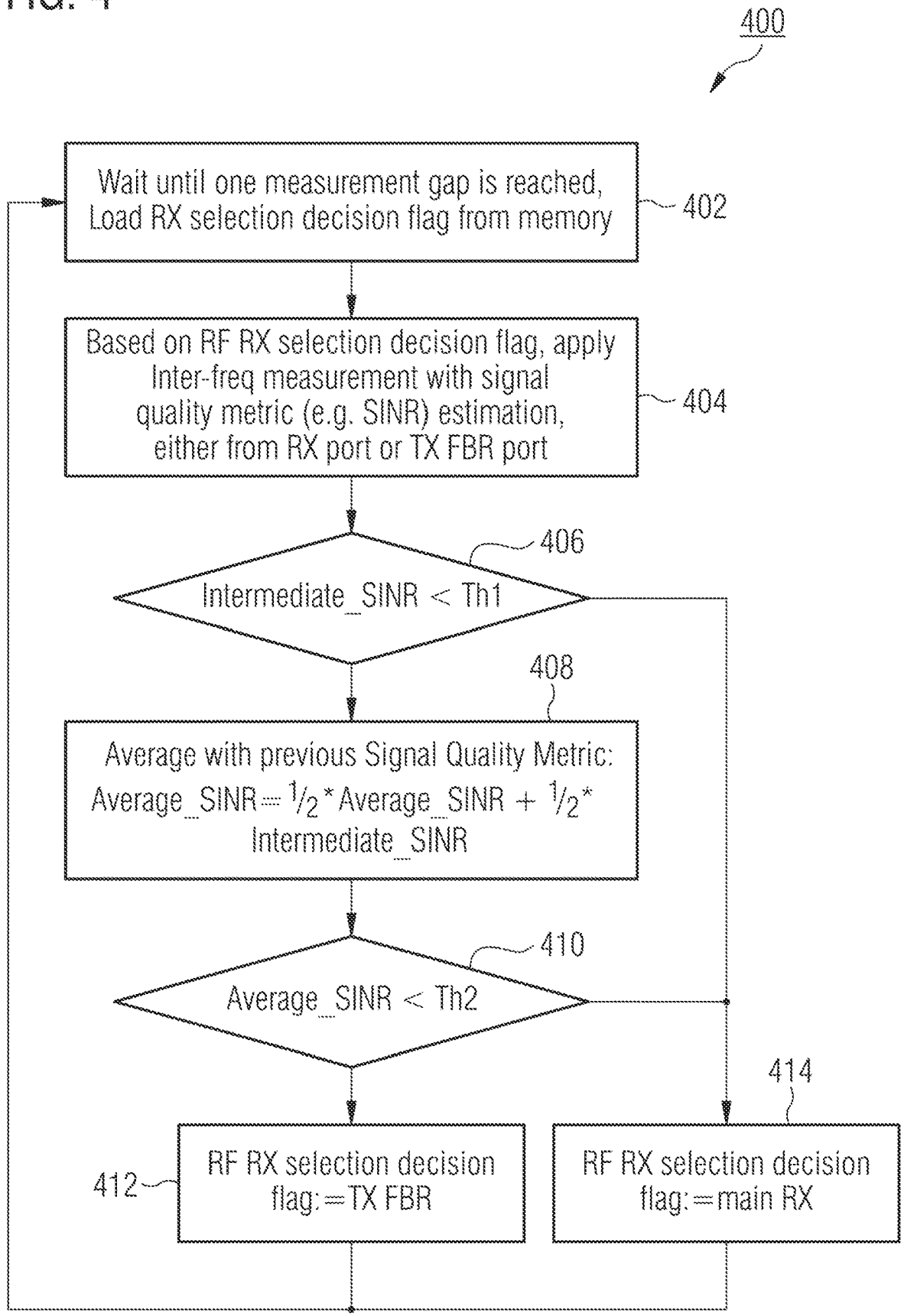
FIG. 4 shows a flowchart for dynamic RF receiver port switching between a main receiver and a transmitter feedback receiver based on receiving signal quality tracking.

FIG. 4 illustrates a flowchart of a first sub-method 400 relating to dynamic RF receiver port switching based on signal quality awareness.

Method 400 includes waiting 402 until a measurement gap interval is reached. In the latter case an RX selection decision flag is read, wherein the RX selection decision flag indicates whether to select the transmitter feedback receiver or the main receiver of a UE for neighboring cell measurement. Based on the RX selection decision flag, inter-freq measurement with signal quality metric (e.g. Signal-to-Interference-plus-Noise Ratio, SINR) estimation is performed at 404 using either the transmitter feedback receiver or the main receiver. If the current signal quality metric (e.g. SINR) estimation yields a signal quality below a first threshold Th1 in 406, the RX selection decision flag is set to indicate usage of the main receiver at 414. Otherwise, an average signal quality metric may be calculated using past and current signal quality metrics at 408. This average signal quality metric can be compared with a second threshold Th2 at 410. If the average signal quality metric yields a signal quality below the second threshold Th2 in 410, the RX selection decision flag is set to indicate usage of the main receiver at 414. Otherwise, the RX selection decision flag is set to indicate usage of the transmitter feedback receiver at 412. Then, method restarts with act 402. Thus, according to method 400, a UE may be configured to measure a measurement signal quality when measuring one or more neighboring cells, and, if the measurement signal quality exceeds a predefined threshold, to select the transmitter feedback receiver for measuring the one or more neighboring cells, otherwise to select a main receiver for measuring the one or more neighboring cells.

In case a low-cost suboptimal TX feedback receiver circuit is used, it cannot support full-set sensitivity range according to 3GPP standardization but only a sub-set. To overcome this issue, method 400 proposes to run-time measure the signal quality when applying neighboring measurement and track the signal quality in the field. Based on the tracked signal quality, in case the tracked signal quality metric (for example SINR) is below a predefined threshold, the UE can fall back to legacy scheme (using main RF receiver port with measurement gap interruption) in the next measurement gap. In case the signal quality metric is higher than a pre-defined threshold, the TX feedback receiver is re-activated again.

Figure 5:
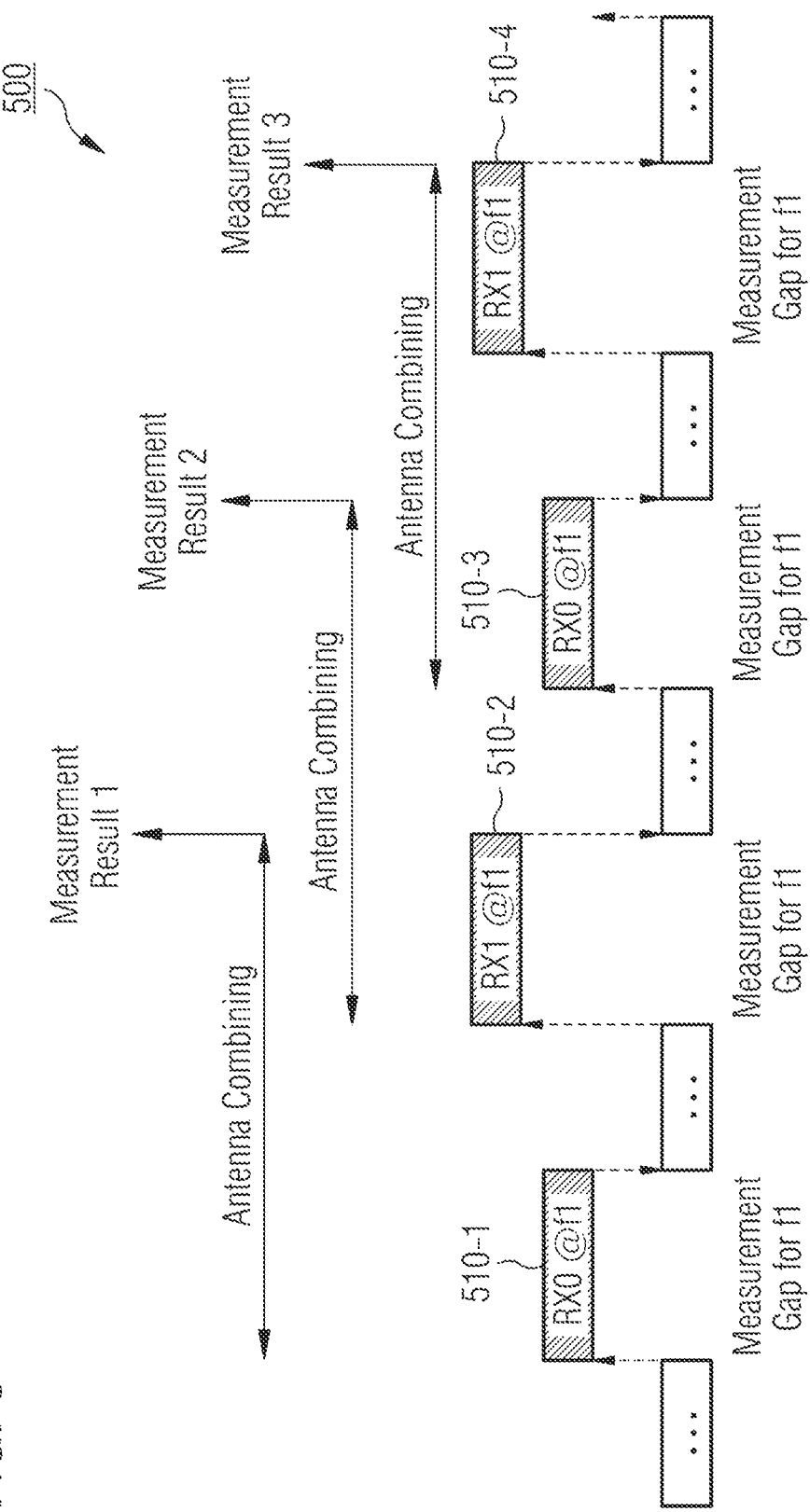
FIG. 5 illustrates a concept of pipelined antenna combining.

FIG. 5 illustrates an example of a second sub-method 500 relating to alternating physical antenna connection per measurement gap and pipeline combining.

FIG. 5 shows a time line with measurement gaps 510 for neighbor cell measurements. Subsequent measurement gaps 510-n and 510-(n+1) (n=1, 2, 3, . . . ) use different RX antennas for neighbor cell measurement, respectively. Antenna combining, such as Maximum Ratio Combining (MRC), may then be used to combine the measurement results from different measurement gaps, hence, different antennas. Thus, control circuitry 240 may be configured to couple the UE's transmitter feedback receiver to a first RX antenna during a first measurement interval of the second mode of operation and to couple the transmitter feedback receiver to a second RX antenna during a second measurement interval of the second mode of operation and to combine measurements of the first and the second measurement interval. Thereby a Signal-to-Noise Ratio (SNR) of the measured signals may be increased.

Method 500 proposes a UE to alternate the connection of different the physical antennas with the transmitter feedback receiver in different measurement gaps, apply inter-freq neighboring cell search and measurement on the respective connected physical antenna, and combine the results with the previous gap where the other physical antenna was connected. By using this scheme, comparing with current antenna combining algorithm in cell search component (non-coherent combining for cell detection+maximal antenna selection for Reference Signal Received Power, RSRP, measurement) for LTE cell search and measurement, for low-mobility scenarios there is no performance loss. For extreme high-mobility scenarios, the performance loss in worst case is 2 dB, but still within the margin to satisfied 3GPP requirement. Please note that by using this idea, the measurement update rate is not halved but kept the same because of the pipelined antenna combining.

Figure 6:
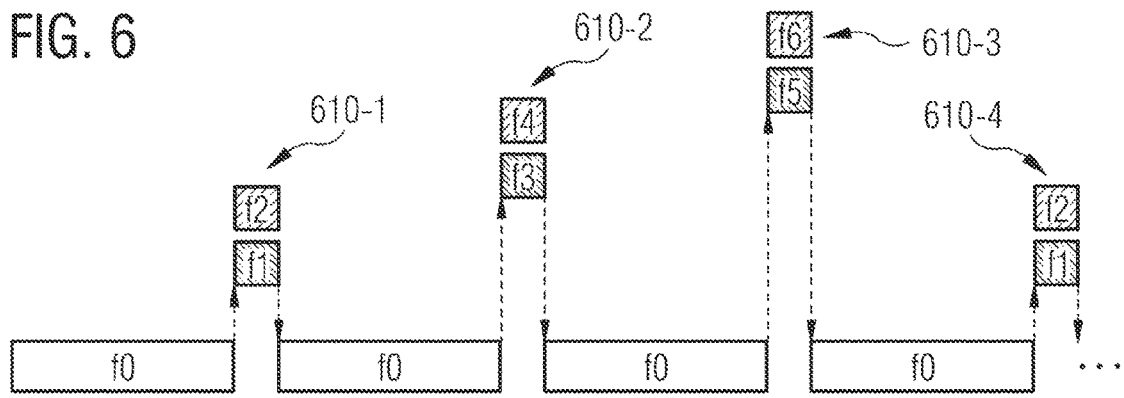
FIG. 6 shows an example of increasing inter-freq measurement rate by a transmitter feedback receiver.

Turning now to FIG. 6, it is illustrated an example scheduling diagram where inter-freq measurements are performed using the transmitter feedback receiver on top of (i.e., in addition) to conventional measurement gap handling by a main receiver. In this way more than one inter-frequency carrier can be measured at the same time. For example, during measurement gap 610-1 a first neighbor cell operating at carrier frequency f1 is measured using the main receiver, while a second neighbor cell operating at carrier frequency f2 is measured using the transmitter feedback receiver. During subsequent measurement gap 610-2 a third neighbor cell operating at carrier frequency f3 is measured using the main receiver, while a fourth neighbor cell operating at carrier frequency f4 is measured using the transmitter feedback receiver. During subsequent measurement gap 610-3 a fifth neighbor cell operating at carrier frequency f5 is measured using the main receiver, while a sixth neighbor cell operating at carrier frequency f6 is measured using the transmitter feedback receiver. During subsequent measurement gap 610-5 the first neighbor cell operating at carrier frequency f1 is measured again using the main receiver, while the second neighbor cell operating at carrier frequency f2 is measured again using the transmitter feedback receiver, and so on. Thus, the main receiver and the transmitter feedback receiver of a UE may be configured to simultaneously measure different neighboring cells during dedicated measurement periods (measurement gaps). This can improve the measurement update rate, so that better LTE handover performance can be achieved.

In other example implementations, the main receiver could also continue demodulating a serving cell signal, while the transmitter feedback receiver measures one or more neighbor cells during measurement gaps. Thus, the main receiver could also be configured to receive the serving cell signal and the transmitter feedback receiver could be configured to simultaneously measure one or more neighboring cells.

Figure 7:
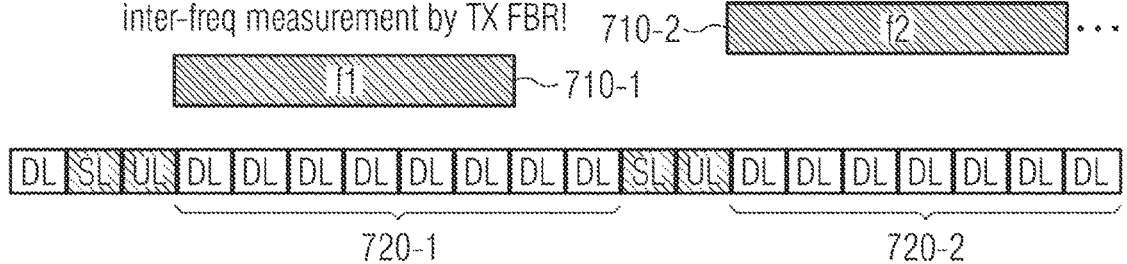
FIG. 7 shows an example of applying inter-freq measurement by a transmitter feedback receiver during Time Division Duplex (TDD) downlink sub-frames without measurement gap interruptions.

Another example relating to Time Division Duplex (TDD) scenarios is shown in FIG. 7. Here, neighbor cell measurements 710 are done with the transmitter feedback receiver during downlink sub-frames 720 which are demodulated with a UE's main receiver. In LTE TDD scenarios, a UE can indicate the eNodeB to disable the measurement gap assignments. For example, this can be done by setting interFreqNeedForGaps in UE-EUTRA-Capability structure to be false. Here, a UE can perform inter-freq measurement using its transmitter feedback receiver during TDD downlink sub-frames or special sub-frames. Note that at TDD downlink or special sub-frames, uplink TX can be disabled so the TX feedback receiver is free for use. Thus, in some examples, a UE may be configured for TDD operation and its transmitter feedback receiver may be configured to measure one or more neighboring cells during TDD downlink frames. This will not only improve the LTE inter-freq measurement update rate for better handover performance, but also significantly improve the throughput performance. That is because the downlink data reception and uplink data transmission are not interrupted by inter-freq measurement gaps. Consider an example scenario where each 6 ms measurement gap is allocated every 40 ms starting at sub-fame 5. In this example assume TDD VLDL config index to be 5. In this scenario, if measurement gaps are removed by using the proposed scheme, then this means 6/8*4=18% throughput increase, while at the same time the inter-freq handover performance is also kept.

Figure 8:
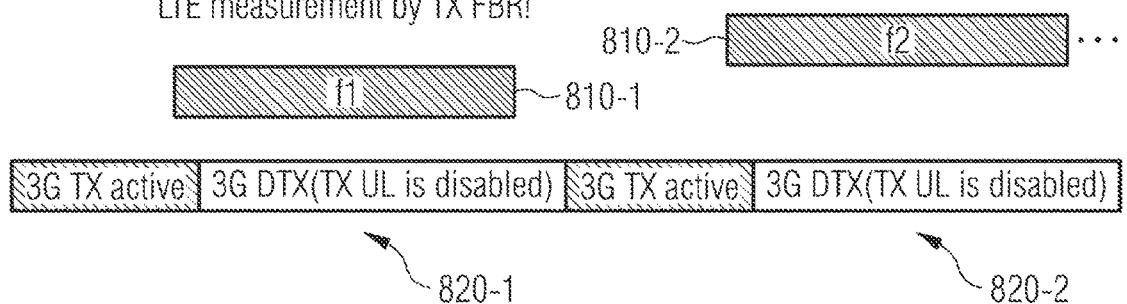
FIG. 8 shows an example of applying inter-RAT measurement by a transmitter feedback receiver during 3G DTX (discontinuous transmission) period.

A further possible scheme relating to discontinuous transmission (DTX) is shown in FIG. 8. Here, neighbor cell measurements 810 are performed with the transmitter feedback receiver during periods 820 of TX inactivity. In 3G High Speed Packet Access (HSPA) discontinuous transmission (DTX) scenarios, when TX uplink is off, the UE can apply the proposed scheme to do LTE measurements by TX feedback receiver. Thus, a UE can be configured for DTX and its transmitter feedback receiver can be configured to measure one or more neighboring cells during periods of data transmission inactivity. This can improve the inter-RAT performance because besides of the existing 3G measurement gaps which are assigned to LTE. LTE then has more time opportunities to apply neighboring cell search and measurement in non-3G-gap locations, and therefore can achieve higher measurement update rate and therefore better handover performance. Please note that it can also help removing LTE i-RAT gap allocations for HSPA.

In a further example, dedicated licensed Frequency Division Duplex (FDD) LTE measurement gaps can be exploited in order to identify the availability of shared TDD bands for 3GPP Licensed-Assisted Access (LAA) usage. Thereby LAA refers to the use of the 4G LTE radio communications technology in unlicensed spectrum, such as the 5 GHz band used by dual-band WiFi equipment. When shared bands are available, they can be combined through FDD/TDD carrier aggregation. Measurement gaps may be introduced in the shared band emissions that coincide with the gaps in the dedicated licensed bands. Then, a UE's TX feedback receiver can be exploited during those gaps to identify whether a priority system is coming back and the band needs to be vacated. In case that it cannot be ensured that the gaps in the dedicated licensed band and the shared band perfectly coincide, then either
  i) the detection of the incumbent needs to be done by specific resources in the shared band during gaps that are introduced in the shared band emissions that do not coincide with the dedicated licensed gaps, or
  ii) the detection of the incumbent fully relies on entries in a database that provides all required information on higher priority users.

Figure 9:
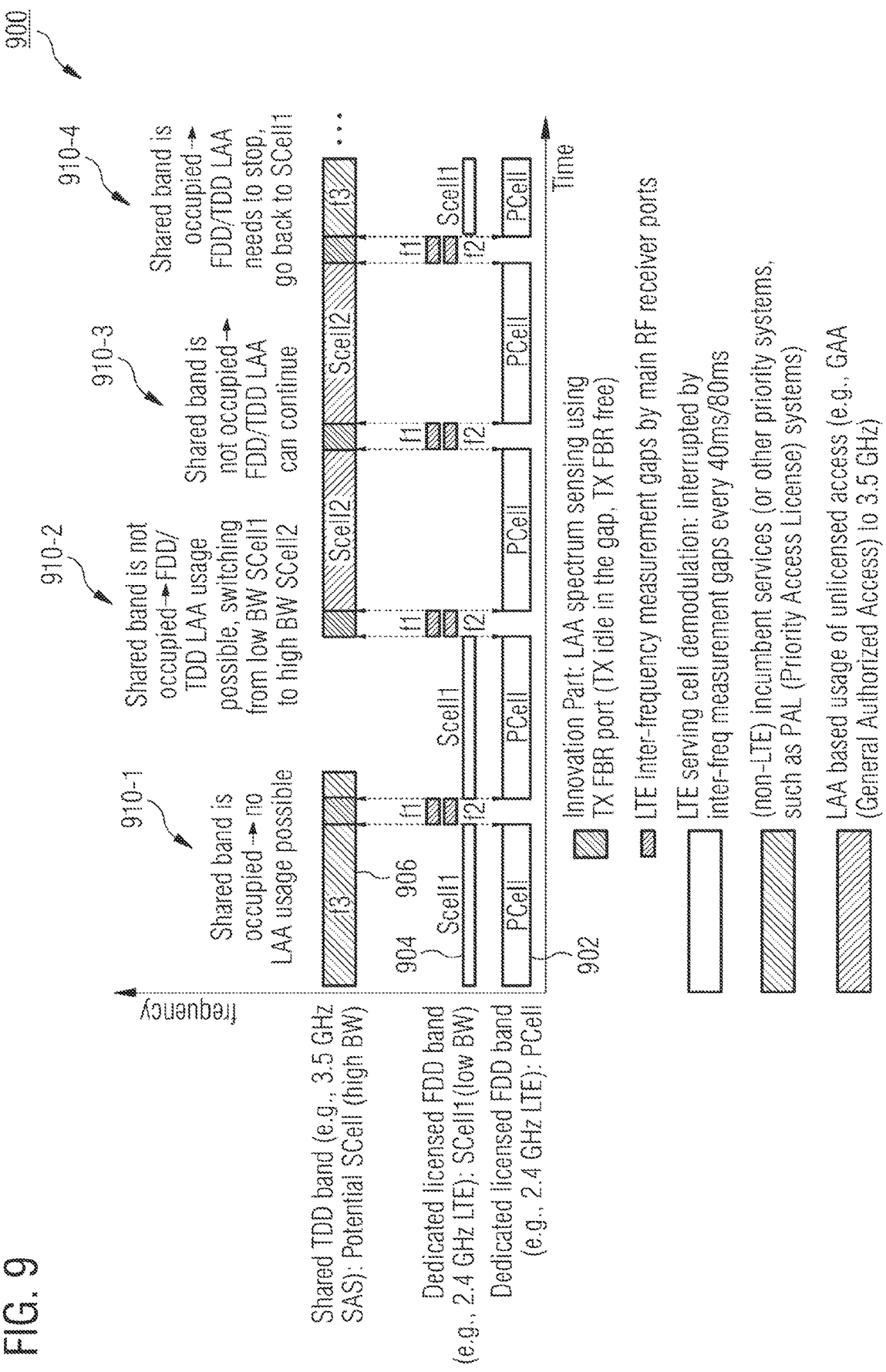
FIG. 9 illustrates an example of identifying access in a TDD shared band (different from the original FDD dedicated licensed band) and joint LAA operation of both bands through FDD/TDD CA.

An example of the proposed method 900 is shown in FIG. 9. In this example, at first UE operates in Carrier Aggregation (CA) mode where both a Primary serving Cell (PCell) and a Secondary serving Cell (Scell1) operate at dedicated licensed FDD bands. The skilled person having benefit from the present disclosure will appreciate that the UE's Radio Resource Control (RRC) connection is handled by PCell served by Primary Component Carrier (PCC) 902. Other component carriers are all referred to as Secondary Component Carriers (SCC) 904, serving the Secondary serving cells. The SCCs can be added and removed as required, while the PCC is only changed at handover. As illustrated in FIG. 9, both main RF receiver ports of UE are busy with downlink reception and demodulation from PCell and Scell1. Even in measurement gaps 910, both RF receiver ports are fully occupied for dual inter-freq layer measurement in parallel at frequencies f1 and f2.

The illustrated example, TX feedback receiver port can be used for receiving RF samples from the unlicensed band 906 at frequency f3 for spectrum sensing. Thus, TX feedback receiver can be configured to measure one or more neighboring inter-frequency or inter-RAT cells in unlicensed frequency spectrum. This can be done during each measurement gap slot 910 where TX is anyhow idle. When it is detected that the unlicensed band f3 is not used by other incumbents, UE can de-activate Scell1 (lower bandwidth) in the licensed band and can add a new Scell2 (higher bandwidth) as Secondary serving cell in the unlicensed band at f3 and can operate in TDD/FDD joint CA mode. Later on (after measurement gap 910-4 in the illustrated example), UE can switch back to Scell1 if TX feedback receiver detects that there are incumbents in the unlicensed band 906 again.

To summarize, the present disclosure proposes to apply inter-freq measurement using a UE's TX FeedBack Receiver (FBR), which is an existing component in multiple existing RF transceivers. It usually serves the main purposes for closed-loop transmission power control and TX calibration. It contains already a full RF receiver chain starting from getting analog RF signals until generating final digitalized IQ streams. This is feasible because during inter-freq measurement gaps, TX UL transmission is disabled, so TX FBR at this moment is free for downlink reception.

Based on this, we further propose several extended methods, with the purpose of increasing LTE DL throughput and handover performance. In a first method, at LTE inter-freq measurement gap locations, the UE applies the proposed concept to do LTE inter-freq measurements by TX FBR on top of conventional measurement gap handling by a main receiver, so that more than one inter-frequency carrier can be measured at the same time. This can improve the measurement update rate so that better LTE handover performance can be achieved, e.g. better satisfies IncMon feature in 3GPP Rel. 12.

In a second method, in LTE TDD scenarios, UE can indicate a eNodeB to completely disable the measurement gap assignments, and make use of the proposed concept to do inter-freq measurements by TX FBR during TDD DL sub-frames or Special sub-frames (Note that at TDD DL/Special sub-frames, UL TX is IDLE so the TX FBR is again available). Note that this is fully compatible with 3GPP: UE could indicate eNodeB to disable measurement gap pattern assignment through UE-EUTRA-Capability structure by setting interFreqNeedForGaps to be false. This can significantly improve the DL throughput performance because instead of granting measurement gaps, eNodeB can schedule more DL traffic.

In a third method, in 3G HSPA discontinuous transmission (DTX) scenarios, when TX UL is off, the UE can apply the proposed concept to do LTE measurements by TX FBR. This can improve the iRAT performance because besides of the existing 3G measurement gaps which are assigned to LTE, LTE has more time opportunities to apply neighboring cell search and measurement in non-3G-gap locations, and therefore can achieve higher measurement update rate.

A fourth method relates to FDD/TDD carrier aggregation and Licensed-Assisted Access (LAA). LAA can dynamically aggregate 3GPP LTE FDD licensed bands with other unlicensed TDD bands, such as 3.5 GHz SAS bands, where LTE is sharing spectrum with incumbents (for example WiFi). The proposed concept can be applied for sensing the targeted unlicensed channel before transmission (e.g. Listen Before Talk (LBT) mechanisms) using TX FBR. Basically, during the LBT, a user is checking the channel availability and transmits only if the channel is clear. Without the current proposal, in FDD systems this would interrupt the main RF RX port for spectrum sensing in unlicensed band (listen mode). By using TX FBR for the spectrum sensing when TX is idle (for example during the measurements gap) of the FDD mode, the normal processing at RX would not have to be interrupted for spectrum sensing.

The skilled person having benefit from the present disclosure will appreciate that the various examples described herein can be implemented individually or in combination.

Figure 11:
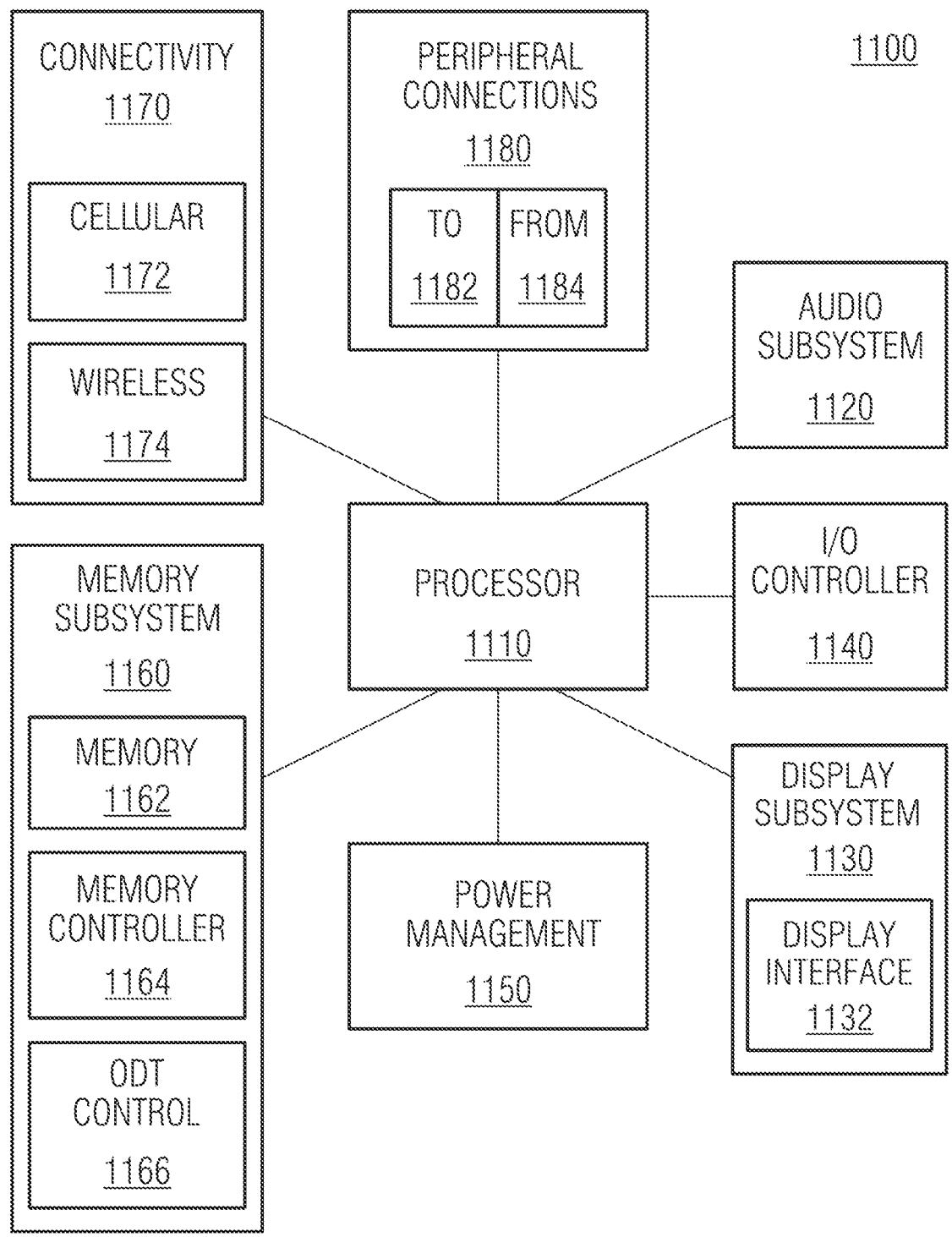
FIG. 11 shows a mobile device implementing examples of the present disclosure.

FIG. 11 is a more detailed block diagram of an example of a device, e.g. a mobile device, in which measuring one or more neighboring inter-frequency or inter-RAT cells with a TX feedback receiver according to example implementations can be implemented. Device 1100 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 1100.

Device 1100 includes processor 1110, which performs the primary processing operations of device 1100. Processor 1110 can include one or more physical devices, such as microprocessors, application processors, microcontrollers, programmable logic devices, or other processing means. The processing operations performed by processor 1110 include the execution of an operating platform or operating system on which applications and/or device functions are executed. The processing operations include operations related to I/O (input/output) with a human user or with other devices, operations related to power management, and/or operations related to connecting device 1100 to another device. The processing operations can also include operations related to audio I/O and/or display I/O.

In one embodiment, device 1100 includes audio subsystem 1120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1100, or connected to device 1100. In one embodiment, a user interacts with device 1100 by providing audio commands that are received and processed by processor 1110.

Display subsystem 1130 represents hardware (e.g., display devices) and software (e.g., drivers) components that provide a visual and/or tactile display for a user to interact with the computing device. Display subsystem 1130 includes display interface 1132, which includes the particular screen or hardware device used to provide a display to a user. In one embodiment, display interface 1132 includes logic separate from processor 1110 to perform at least some processing related to the display. In one embodiment, display subsystem 1130 includes a touchscreen device that provides both output and input to a user. In one embodiment, display subsystem 1130 includes a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others.

I/O controller 1140 represents hardware devices and software components related to interaction with a user. I/O controller 1140 can operate to manage hardware that is part of audio subsystem 1120 and/or display subsystem 1130. Additionally, I/O controller 1140 illustrates a connection point for additional devices that connect to device 1100 through which a user might interact with the system. For example, devices that can be attached to device 1100 might include microphone devices, speaker or stereo systems, video systems or other display device, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of device 1100. Additionally, audio output can be provided instead of or in addition to display output. In another example, if display subsystem includes a touchscreen, the display device also acts as an input device, which can be at least partially managed by I/O controller 1140. There can also be additional buttons or switches on device 1100 to provide I/O functions managed by I/O controller 1140.

In one embodiment, I/O controller 1140 manages devices such as accelerometers, cameras, light sensors or other environmental sensors, gyroscopes, global positioning system (GPS), or other hardware that can be included in device 1100. The input can be part of direct user interaction, as well as providing environmental input to the system to influence its operations (such as filtering for noise, adjusting displays for brightness detection, applying a flash for a camera, or other features). In one embodiment, device 1100 includes power management 1150 that manages battery power usage, charging of the battery, and features related to power saving operation.

Memory subsystem 1160 includes memory device(s) 1162 for storing information in device 1100. Memory subsystem 1160 can include nonvolatile (state does not change if power to the memory device is interrupted) and/or volatile (state is indeterminate if power to the memory device is interrupted) memory devices. Memory 1160 can store application data, user data, music, photos, documents, or other data, as well as system data (whether long-term or temporary) related to the execution of the applications and functions of system 1100. In one embodiment, memory subsystem 1160 includes memory controller 1164 (which could also be considered part of the control of system 1100, and could potentially be considered part of processor 1110). Memory controller 1164 includes a scheduler to generate and issue commands to memory device 1162.

Connectivity 1170 includes hardware devices (e.g., wireless and/or wired connectors and communication hardware) and software components (e.g., drivers, protocol stacks) to enable device 1100 to communicate with external devices. The external device could be separate devices, such as other computing devices, wireless access points or base stations, as well as peripherals such as headsets, printers, or other devices.

Connectivity 1170 can include multiple different types of connectivity. To generalize, device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1174 refers to wireless connectivity that is not cellular, and can include personal area networks (such as Bluetooth), local area networks (such as WiFi), and/or wide area networks (such as WiMax), or other wireless communication, such as NFC. Wireless communication refers to transfer of data through the use of modulated electromagnetic radiation through a non-solid medium. Wired communication occurs through a solid communication medium. Cellular connectivity 1172 and/or wireless connectivity 1174 can implement example transceivers of the present disclosure for measuring one or more neighboring inter-frequency or inter-RAT cells with a TX feedback receiver.

Peripheral connections 1180 include hardware interfaces and connectors, as well as software components (e.g., drivers, protocol stacks) to make peripheral connections. It will be understood that device 1100 could both be a peripheral device ("to" 1182) to other computing devices, as well as have peripheral devices ("from" 1184) connected to it. Device 1100 commonly has a "docking" connector to connect to other computing devices for purposes such as managing (e.g., downloading and/or uploading, changing, synchronizing) content on device 1100. Additionally, a docking connector can allow device 1100 to connect to certain peripherals that allow device 1100 to control content output, for example, to audiovisual or other systems.

In addition to a proprietary docking connector or other proprietary connection hardware, device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

The following examples pertain to further embodiments.

Example 1 is a user equipment for a wireless or cellular communication system. The user equipment comprises a transmitter configured to generate a transmit signal, a transmitter feedback receiver coupled to the transmitter and configured to measure a power of the transmit signal in a first mode of operation, and control circuitry configured to select a second mode of operation of the transmitter feedback receiver, in which the transmitter feedback receiver is configured to measure one or more neighboring inter-frequency or inter-RAT cells or base stations.

In Example 2, the control circuitry of Example 1 can further optionally be configured to deactivate at least a portion of the transmitter during the second mode of operation.

In Example 3, the transmitter feedback receiver of any of the previous Examples can optionally be coupled to a controllable local oscillator operating at constant frequency during the second mode of operation.

In Example 4, the user equipment of any of the preceding Examples can further optionally comprise a main receiver configured to receive a serving cell or base station signal at one or more serving cell or base station carrier frequencies.

In Example 5, the main receiver and the transmitter feedback receiver of Example 4 can be configured to receive the serving cell signal and to simultaneously measure the one or more neighboring cells or base stations.

In Example 6, the main receiver and the transmitter feedback receiver of Example 4 can be configured to simultaneously measure different neighboring cells or base stations during dedicated measurement periods.

In Example 7, the control circuitry of any of the preceding Examples can be configured to disable the transmitter during predefined time periods and the transmitter feedback receiver of any of the preceding Examples can be configured to measure the one or more neighboring cells during said predefined periods.

In Example 8, the user equipment of any of the preceding Examples can be configured for Time Division Duplex (TDD) operation and the transmitter feedback receiver of any of the preceding Examples can be configured to measure the one or more neighboring cells or base stations during TDD downlink frames.

In Example 9, the user equipment of any of the preceding Examples can be configured for discontinuous transmission and the transmitter feedback receiver of any of the preceding Examples can be configured to measure the one or more neighboring cells or base stations during periods of data transmission inactivity.

In Example 10, the transmitter feedback receiver of any of the preceding Examples can be configured to measure the one or more neighboring inter-frequency or inter-RAT cells or base stations in unlicensed frequency spectrum.

In Example 11, the transmitter and the transmitter feedback receiver of any of the preceding Examples can be both coupled to the same controllable local oscillator.

In Example 12, the transmitter and the transmitter feedback receiver of any of the preceding Examples can be activated simultaneously during the first mode of operation.

In Example 13, the transmitter feedback receiver of any of the preceding Examples can comprise a first Low-Noise Amplifier (LNA) with a first noise figure and a first gain for use during the first mode of operation and a second LNA with a second noise figure lower than the first noise figure and with a second gain higher than the first gain for use during the second mode of operation.

In Example 14, the user equipment of any of the preceding Examples can optionally comprise one or more switches configured to couple the transmitter feedback receiver to a transmit path of the transmit circuitry during the first mode of operation and to couple the transmitter feedback receiver to at least one antenna during the second mode of operation.

In Example 15, the user equipment of any of the preceding Examples can be configured to measure a measurement signal quality when measuring the one or more neighboring cells or base stations, and, if the measurement signal quality exceeds a predefined threshold, to select the transmitter feedback receiver for measuring the one or more neighboring cells or base stations, otherwise to select a main receiver for measuring the one or more neighboring cells or base stations.

In Example 16, the control circuitry of any of the preceding Examples can optionally be configured to couple the transmitter feedback receiver to a first antenna during a first measurement interval of the second mode of operation and to couple the transmitter feedback receiver to a second antenna during a second measurement interval of the second mode of operation and to combine measurements of the first and the second measurement interval.

Example 17 is a transceiver device comprising transmit circuitry configured to generate an RF transmit signal, a transmitter feedback receiver coupled to the transmit circuitry and configured to measure a fed back version of the RF transmit signal during a first mode of operation, main receiver circuitry configured to receive a serving cell signal at one or more RF carrier frequencies, and control circuitry configured to select a second mode of operation of the transmitter feedback receiver, in which the transmitter feedback receiver is configured to perform spectrum sensing, and to decouple the transmitter feedback receiver from a transmit path of the transmit circuitry during the second mode of operation.

In Example 18, the main receiver circuitry of Example 17 can be configured to measure a first neighboring cell or base station during a dedicated measurement period and the transmitter feedback receiver can be configured to measure a second neighboring cell or base station during the dedicated measurement period.

Example 19 is a method for measuring one or more neighboring inter-frequency or inter-RAT cells or base stations with a user equipment of a wireless or cellular communication system, the user equipment comprising a transmitter configured to generate a transmit signal. The method includes using, in a first mode of operation, a transmitter feedback receiver coupled to the transmitter during the first mode of operation for measuring a power of the transmit signal, and using, in a second mode of operation, the transmitter feedback receiver for measuring the one or more neighboring inter-frequency or inter-RAT cells or base stations.

In Example 20, the method of Example 19 can further optionally include decoupling the transmitter feedback receiver from a transmit signal path of the transmitter during the second mode of operation.

In Example 21, the method of any of Examples 19 or 20 can further optionally include coupling the transmitter feedback receiver to a controllable local oscillator operating at constant RF frequency during the second mode of operation.

In Example 22, the method of any of Examples 19 to 21 can further optionally include using a main receiver of the user equipment for receiving a serving cell or base station signal at one or more RF carrier frequencies.

In Example 23, the method of Example 22 can further optionally include receiving the serving cell signal with the main receiver and simultaneously measuring the one or more neighboring cells or base stations with the transmitter feedback receiver.

In Example 24, the method of Example 22 can further optionally include simultaneously measuring different neighboring cells or base stations during dedicated measurement periods with the main receiver and the transmitter feedback receiver.

In Example 25, the method of any of Examples 19 to 24 can further optionally include disabling at least a portion of the transmitter during predefined time periods and measuring the one or more neighboring cells or base stations during said predefined periods using the transmitter feedback receiver.

In Example 26, the method of any of Examples 19 to 25 can further optionally include measuring the one or more neighboring cells or base stations with the transmitter feedback receiver during Time Division Duplex (TDD) downlink frames.

In Example 27, the method of any of Examples 19 to 26 can further optionally include measuring the one or more neighboring cells or base stations with the transmitter feedback receiver during periods of data transmission inactivity of discontinuous transmission.

In Example 28, the method of any of Examples 19 to 27 can further optionally include measuring the one or more neighboring cells or base stations with the transmitter feedback receiver in unlicensed frequency spectrum.

In Example 29, the method of any of Examples 19 to 28 can further optionally include simultaneously activating the transmitter and the transmitter feedback receiver during the first mode of operation.

In Example 30, measuring the one or more neighboring cells or base stations can include measuring a measurement signal quality, and, if the measurement signal quality exceeds a predefined threshold, selecting the transmitter feedback receiver for measuring the one or more neighboring cells, otherwise selecting a main receiver for measuring the one or more neighboring cells or base stations.

In Example 31, the method of any of Examples 19 to 30 can further optionally include connecting the transmitter feedback receiver to a first antenna during a first measurement interval of the second mode of operation, connecting the transmitter feedback receiver to a second antenna during a second measurement interval of the second mode of operation, and combining measurements of the first and the second measurement interval.

Example 32 is a computer program product comprising a non-transitory computer readable medium having computer readable program code embodied therein, wherein the computer readable program code, when being loaded on a computer, a processor, or a programmable hardware component, is configured to implement a method for measuring one or more neighboring inter-frequency or inter-RAT cells or base stations with a user equipment of a wireless communication system, the user equipment comprising a transmitter configured to generate a transmit signal, the method comprising:

determining, in a first mode of operation, a power of the transmit signal using a transmitter feedback receiver coupled to the transmitter during the first mode of operation; and determining, in a second mode of operation, the one or more neighboring inter-frequency or inter-RAT cells or base stations using the transmitter feedback receiver.

The aspects and features mentioned and described together with one or more of the previously detailed examples and figures, may as well be combined with one or more of the other examples in order to replace a like feature of the other example or in order to additionally introduce the feature to the other example.

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. User equipment for a wireless communication system, comprising:
    a transmitter configured to generate a transmit signal;
    a transmitter feedback receiver;
    a main receiver; and
    control circuitry configured to:
        couple the transmitter feedback receiver to the transmitter for a first mode of operation and decouple the transmitter feedback receiver from the transmitter for a second mode of operation;
        measure a power of the transmit signal by using the transmitter feedback receiver operating in the first mode of operation; and
        measure one or more neighboring inter-frequency or inter-RAT base stations by selecting, based on an indication of whether previous signal quality measurements of neighboring inter-frequency or inter-RAT base stations exceed a predefined threshold, and using at least one of:
            the transmitter feedback receiver operating in the second mode of operation; or
            the main receiver.

2. The user equipment of claim 1, wherein the control circuitry is configured to deactivate at least a portion of the transmitter during the second mode of operation.

3. The user equipment of claim 1, wherein the transmitter feedback receiver is coupled to a controllable local oscillator operating at constant frequency during the second mode of operation.

4. The user equipment of claim 1, further comprising:
    a main receiver configured to receive a signal from a serving base station at one or more carrier frequencies.

5. The user equipment of claim 4, wherein the main receiver and the transmitter feedback receiver are configured to receive the signal from a serving base station, and wherein the control circuitry is configured to measure the one or more neighboring inter-frequency or inter-RAT base stations by simultaneously using:
    the transmitter feedback receiver operating in the second mode of operation; and
    the main receiver.

6. The user equipment of claim 4, wherein the control circuit is configured to measure different neighboring inter-frequency or inter-RAT base stations during dedicated measurement periods by simultaneously using:
    the transmitter feedback receiver operating in the second mode of operation; and
    the main receiver.

7. The user equipment of claim 1, wherein the control circuitry is configured to:
    disable the transmitter during predefined time periods; and
    measure the one or more neighboring inter-frequency or inter-RAT base stations by using the transmitter feedback receiver operating in the second mode of operation during the predefined periods.

8. The user equipment of claim 1, wherein the user equipment is configured for Time Division Duplex, TDD, operation and wherein the control circuitry is configured to measure the one or more neighboring inter-frequency or inter-RAT base stations by using the transmitter feedback receiver operating in the second mode of operation during TDD downlink frames.

9. The user equipment of claim 1, wherein the user equipment is configured for discontinuous transmission and wherein the control circuitry is configured to measure the one or more neighboring inter-frequency or inter-RAT base stations by using the transmitter feedback receiver operating in the second mode of operation during periods of data transmission inactivity.

10. The user equipment of claim 1, wherein the control circuitry is configured to measure the one or more neighboring inter-frequency or inter-RAT base stations by using the transmitter feedback receiver operating in the second mode of operation, in unlicensed frequency spectrum.

11. The user equipment of claim 1, wherein the transmitter and the transmitter feedback receiver are both coupled to the same controllable local oscillator.

12. The user equipment of claim 1, wherein the transmitter and the transmitter feedback receiver are activated simultaneously during the first mode of operation.

13. The user equipment of claim 1, wherein the transmitter feedback receiver comprises a first Low-Noise Amplifier, LNA, with a first noise figure and a first gain for use during the first mode of operation and a second LNA with a second noise figure lower than the first noise figure and with a second gain higher than the first gain for use during the second mode of operation.

14. The user equipment of claim 1, comprising a switch configured to couple the transmitter feedback receiver to a transmit path of the transmit circuitry during the first mode of operation and to couple the transmitter feedback receiver to at least one antenna during the second mode of operation.

15. The user equipment of claim 1, wherein the control circuitry is configured to:
    select the transmitter feedback receiver operating in the second mode of operation for measuring the one or more neighboring inter-frequency or inter-RAT base stations responsive to an indication that the previous signal quality measurements exceed the predefined threshold; and
    select the main receiver for measuring the one or more inter-frequency or inter-RAT neighboring base stations responsive to an indication that the previous signal quality measurements do not exceed the predefined threshold.

16. The user equipment of claim 1, wherein the control circuitry is configured to:
    couple the transmitter feedback receiver to a first antenna during a first measurement interval of the second mode of operation;
    couple the transmitter feedback receiver to a second antenna during a second measurement interval of the second mode of operation; and
    combine measurements of the first measurement interval and the second measurement interval.

17. Method for measuring one or more neighboring inter-frequency or inter-RAT base stations with a user equipment of a wireless communication system, the user equipment comprising a transmitter configured to generate a transmit signal, the method comprising:
    measuring a power of the transmit signal by using a transmitter feedback receiver coupled to the transmitter for measuring a power of the transmit signal; and
    measuring the one or more neighboring inter-frequency or inter-RAT base stations by selecting, responsive to an indication of whether previous signal quality measurements of neighboring inter-frequency or inter-RAT base stations exceed a predefined threshold, and using at least one of:
        the transmitter feedback receiver decoupled from the transmitter for measuring the one or more neighboring inter-frequency or inter-RAT base stations; or a main receiver different from the transmitter feedback receiver.

18. The method of claim 17, further comprising coupling the transmitter feedback receiver to a controllable local oscillator operating at constant RF frequency when measuring the one or more neighboring inter-frequency or inter-RAT base stations by using the transmitter feedback receiver decoupled from the transmitter.

19. The method of claim 17, further comprising:
using the main receiver of the user equipment for receiving a serving base station signal at one or more RF carrier frequencies.

20. The method of claim 19, comprising receiving the serving base station signal with the main receiver and simultaneously measuring the one or more neighboring inter-frequency or inter-RAT base stations by using the transmitter feedback receiver decoupled from the transmitter.

21. The method of claim 19, comprising simultaneously measuring different neighboring base stations during dedicated measurement periods by using the main receiver and the transmitter feedback receiver decoupled from the transmitter.

22. A computer program product comprising a non-transitory computer readable medium having computer readable program code embodied therein, wherein the computer readable program code, when being loaded on a computer, a processor, or a programmable hardware component, is configured to implement a method for measuring one or more neighboring inter-frequency or inter-RAT base stations with a user equipment of a wireless communication system, the user equipment comprising a transmitter configured to generate a transmit signal, the method comprising:
determining a power of the transmit signal using a transmitter feedback receiver coupled to the transmitter for determining the power of the transmit signal; and
measuring the one or more neighboring inter-frequency or inter-RAT base stations by selecting, responsive to an indication of whether previous signal quality measurements of neighboring inter-frequency or inter-RAT base stations exceed a predefined threshold, and using one of:
the transmitter feedback receiver decoupled from the transmitter for measuring the one or more neighboring inter-frequency or inter-RAT base stations; or
a main receiver different from the transmitter feedback receiver.

* * * * *